United States Patent [19]

Higashi et al.

[11] 4,406,765
[45] Sep. 27, 1983

[54] APPARATUS AND PROCESS FOR PRODUCTION OF AMORPHOUS SEMICONDUCTOR

[75] Inventors: Akio Higashi; Kazuhiro Kawaziri; Jin Murayama, all of Asaka, Japan

[73] Assignee: Fuji Photo Film Co., Ltd., Kanagawa, Japan

[21] Appl. No.: 222,168

[22] Filed: Dec. 16, 1980

[30] Foreign Application Priority Data

Jan. 28, 1980 [JP] Japan ................................. 55-9102

[51] Int. Cl.³ ................. H01L 21/316; C23C 11/00; C01B 33/02
[52] U.S. Cl. ........................... 204/164; 422/186.04; 423/349; 427/93; 427/124
[58] Field of Search ............. 204/164; 423/349; 427/82, 93, 124, 294

[56] References Cited

U.S. PATENT DOCUMENTS

| | | | |
|---|---|---|---|
| 3,232,745 | 2/1966 | Rummel et al. | 423/349 X |
| 3,738,828 | 6/1973 | Inoue | 204/164 X |
| 4,125,643 | 11/1978 | Reuschel et al. | 427/9 |
| 4,226,897 | 10/1980 | Coleman | 427/84 |
| 4,289,797 | 9/1981 | Akselrad | 427/39 |

OTHER PUBLICATIONS

Zanzucchi et al., J. Applied Physics, vol. 48, pp. 5227–5236 (12/77).

Primary Examiner—F. Edmundson
Attorney, Agent, or Firm—Sughrue, Mion, Zinn, Macpeak, and Seas

[57] ABSTRACT

A process for producing an amorphous semiconductor membrane. A predetermined gas is introduced into a vacuum chamber which is decomposed by a discharge phenomenon. The discharge phenomenon is caused by an electric field made up of a high frequency electric field or pulsed electric field superposed on a DC electric field.

8 Claims, 3 Drawing Figures

APPARATUS AND PROCESS FOR PRODUCTION OF AMORPHOUS SEMICONDUCTOR

BACKGROUND OF THE INVENTION

1. Field of the Invention

The present invention relates to a process for production of amorphous semiconductor material. More particularly, the invention relates to a process for producing amorphous semiconductor material by glow discharge decomposition.

2. Description of the Prior Art

Amorphous semiconductor films, particularly, amorphous silicon films, have heretofore been prepared by the so-called RF glow discharge decomposition process wherein a mono-silane ($SiH_4$) gas, for example, is decomposed by application of an electrical discharge using high frequency electrical fields. The decomposed gas is deposited on a substrate to form a thin film. Also, amorphous semiconductor members have been prepared using a so-called DC glow discharge decomposition process whererin a thin film is formed in the same manner as in the RF glow discharge decomposition process except that a DC electric field is employed for the production of the discharge.

The amorphous silicon formed by these glow discharge decomposition processes is known to be markedly low in the mean density of states of a local level in an energy gap, specifically, $10^{17}$ to $10^{18}$ cm$^{-3}$, which is different from that of other known processes such as the vapor-deposition process and a process based on sputtering in a hydrogen-free gas atmosphere. This is thought to be due to the fact that the Si-Si bond is cut or the defects resulting from an irregularity of atomic arrangement are compensated by 5 to 30 atomic percent of hydrogen contained in the film. As a result, the amorphous silicon formed by the glow discharge decomposition process can be controlled with respect to valency electrons to form either a p- or n-type semiconductor. This permits the production with amorphous silicon at low cost a large surface area light sensor or devices such as a solar battery, a large surface area photoreceptor, specifically, an electrophotographic light-sensitive member, or other such devices. Recently, the application of amorphous silicon for such devices has increasingly been studied.

In the previously-known glow discharge decomposition processes, however, the production rate is markedly low compared with other common vapor-deposition processes. For example, the *Journal of Applied Physics*, Vol. 48, No. 12, page 5227 (1977), reports that the production rate is about 0.1 to 0.5 μm/min at most. If the film is deposited at a greater rate than the upper limit, the photoconductivity and film-forming properties of the layer obtained will be greatly degraded. For example, if the DC glow discharge decomposition process is carried out at a greater deposition rate than the above value, the uniformity of the film obtained will be greatly inferior, and at a film thickness of bout 10 μm, no film-forming properties will be exhibited. Furthermore, experiments conducted by the inventors have revealed that the photoconductivity is lowered as the uniformity of the film deteriorates.

In the production of silicon amorphous semiconductor material by glow discharge decomposition, an improvement in the deposition rate of the amorphous semiconductor leads to a reduction in the production costs of the amorphous semiconductor.

SUMMARY OF THE INVENTION

An object of the invention is thus to provide a process for producing an amorphous semiconductor film which provides an increased production rate and reduced production cost.

This and other objects of the invention are attained by applying a multiple electric field composed of a DC electric field and a high frequency electric field or pulsed electric field during the deposition of an amorphous semiconductor film.

The invention provides a process for producing an amorphous semiconductor which includes introducing a predetermined gas into a vacuum chamber and causing a discharge phenomenon by applying discharge energy to decompose the introduced gas wherein a multiple electric field composed of a DC electric field and a high frequency electric field or pulsed electric field is applied for causing the discharge.

As a result of extensive investigations carried out to find ways to improve the production rate, it has now been found that the use of a DC electric field in combination with a high frequency electric field or a pulsed electric field in the glow discharge decompensation process improves the production rate and permits the production of silicon amorphous semiconductor material which has uniform properties and has excellent photoconductive characteristics.

The following are considered the reasons for the improvement of the production rate and the provision of uniform films although the exact reasons are imperfectly understood.

One of the reasons is that the DC discharge forms a plasma region locally in a space at the side of the cathode electrode (the electrode to which the minus voltage is applied), the supplied $SiH_4$ gas is abruptly decomposed in the plasma region, and various species maintained in a high energy state reach the substrate and are deposited on or attach to the substrate.

Another reason is that the use of the high frequency electric field or a pulsed electric field having a high frequency component superposed on the DC electric field as a discharge electric field permits the charge on the film being formed to be neutralized by a displacement current. This neutralization of the charge on the film prevents the formation of a film having irregular properties due to dielectric break-down and the disturbance of the DC electric field owing to the charge on the film or the space charge in the vicinity of cathode. Thus, it is made possible to smoothly continue the deposition process.

DESCRIPTION OF THE PREFERRED EMBODIMENTS

The invention will hereinafter be described in greater detail with reference to the accompanying drawings.

Figure 1:
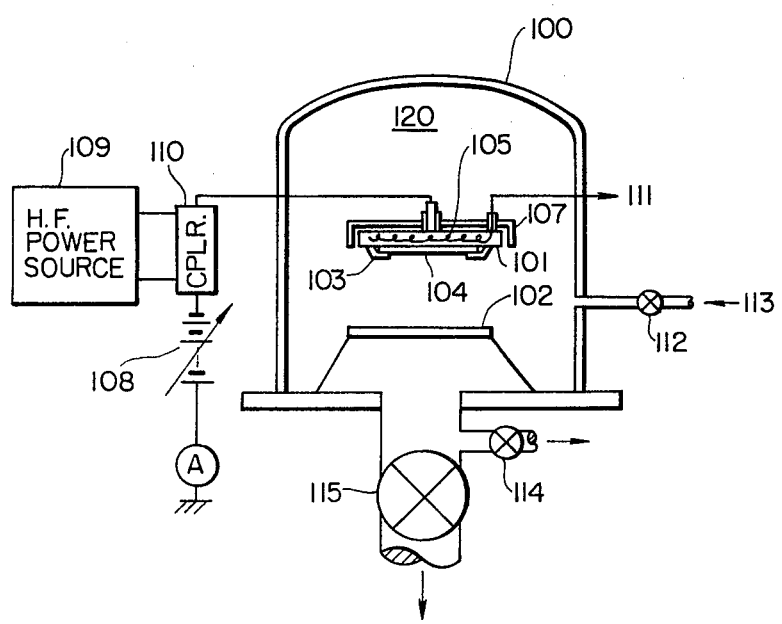
FIG. 1 is a schematic diagram of a glow discharge decomposition apparatus in which the invention is used to advantage.

Referring to FIG. 1, an anode 102 is disposed in a vacuum chamber 120 of a capacity coupled type glow discharge decomposition apparatus 100 at a location below and opposite a glow discharge electrode, cathode 101, spaced apart therefrom a predetermined distance. The cathode 101 is provided with a substrate heating heater 105 connected to a heater power source 111. The heater 105 is used to set the temperature of a substrate 104 at a predetermined value. The substrate 104 is secured by a substrate support member 103. A seal member 107 is provided to prevent the discharge from the cathode 101 from extending into the surrounding space.

The cathode 101 is electrically connected to a DC power source 108. In accordance with a specific feature of the invention, a high frequency electric field or pulsed electric field is produced by a high frequency voltage from a high frequency power source or pulse power source 109 which is coupled through a coupling circuit 110 where it is superposed on a DC electric field. The high frequency electric field or pulsed electric field is required to include at least a component which produces an electric field opposite in polarity to the DC electric field.

A gas 113 is introduced into the vacuum chamber 120 through a needle valve 112 which controls the flow rate of the gas 113. The gas 113 may be made to flow in a direction parallel to the cathode 101 as illustrated in FIG. 1 or, alternatively, it may be made to flow in the form of a ring in the vicinity of the cathode 101. Additionally, it may be made to flow from the side of the anode toward the cathode 101 in a direction perpendicular to the cathode 101.

The vacuum chamber 120 is provided with a diffusion pump valve 115 and a rotary pump valve 114 through which the vacuum chamber 120 is connected to an exhaust device.

In producing a silicon amorphous semiconductor film on a substrate using the glow discharge decomposition equipment as illustrated in FIG. 1, first, the substrate 104, which has been subjected to a cleaning process, is placed on the substrate support member 103. The vacuum chamber 120 is then evacuated using the exhaust device to a pressure of preferably $1 \times 10^{-5}$ torr or less and the temperature of the substrate 104 is maintained at a predetermined temperature by the heater 105. The evacuation of the vacuum chamber 120 is carried out with a rotary pump 114 by closing the diffusion pump valve 115 and opening the rotary pump valve 114. Thereafter, a gas 113 is introduced into the vacuum chamber 120.

As the gas 113 used in producing a silicon amorphous semiconductor film, a gas of silane or a silane derivatives, such as $SiH_4$, $Si_2H_6$, $SiH_2Cl_2$, $SiF_4$, or the like, or a gas prepared by diluting the above-described gas with an inert gas such as $H_2$, He, Ar, Ne which further contains C, N, O or F may be used. For producing an amorphous semiconductor film of a multiple-layer construction which is to be used in a light sensor, a solar battery, an electrophotographic light-sensitive member or the like, a dopant gas such as $PH_3$ or $B_2H_6$ may be mixed in. In addition, a gas such as $GeH_4$ or the like may be introduced.

By controlling the rotary pump valve 114, the pressure of the vacuum chamber 120 is maintained in a range of $10^{-2}$ torr to 10 torr to obtain the desired degree of vacuum in the vacuum chamber 120. As the external electric field used to produce the glow discharge, an electric field produced by superposing the DC electric voltage from the DC power source 108 and the high frequency electric voltage or pulsed electric voltage from the high frequency power source or pulse power source 109 is used. A suitable DC voltage is from 0.1 KV to 5 KV. It is preferable that the frequency of the current being superposed be from 0.1 MHz to 100 MHz and that the pulse width of the pulse voltage be from $10^{-10}$ sec to $10^{-3}$ sec with the pulse cycle time being from $10^{-9}$ sec to $10^{-1}$ sec.

The high frequency electric field or pulsed electric field neutralizes the charge on the insulative substrate or the film formed on the substrate by a displacement current and at the same time prevents the DC electric field from being disturbed by a space charge in the vicinity of the cathode which is produced by the charge formed on the film. In the electrically coupled circuit 110, which includes a resistor, a coil and a capacitor, the high frequency voltage or pulse voltage is superposed on the DC voltage.

The substrate 104 used with the invention may be either an electrically conductive support or an electrically insulative member depending upon the application of the film. The shape of the substrate 104 is not critical and it may be any desired form including a plate, belt, or cylindrical shape.

A suitable temperature for the substrate 104 is from 50° C. to 400° C.

The formation rate in producing a silicon amorphous semiconductor film is markedly improved by the process of the invention as described above. The formation rate increases with an increase in the intensity of the DC electric field and the partial pressure of the introduced gas. It is possible to provide a production rate of 1 $\mu$m/min or more.

The invention, as described above, provides a process for the production of uniform amorphous semiconductor films at an increased rate of formation using glow discharge decomposition. Using the process of the invention, it is possible to produce amorphous semiconductors of elements of Groups III–V, II–VI, etc.

The following examples are given to illustrate the invention in greater detail.

EXAMPLE 1

A silicon amorphous film was produced by introducing Ar-diluted $SiH_4$ gas into the capacity coupled type glow discharge decomposition apparatus shown in FIG. 1 with an electrically conductive substrate support prepared by depositing Corning 7059 glass and an $In_2O_3$ transparent electrode on a glass substrate. For the external electric field used to produce the glow discharge, a composite electric field composed of a DC electric field and a pulsed electric field was used.

Figure 2:
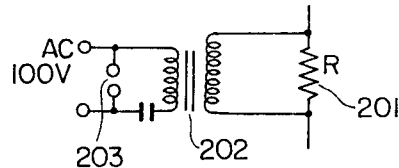
FIG. 2 shows a pulse power source and a coupled circuit.
Figure 2:
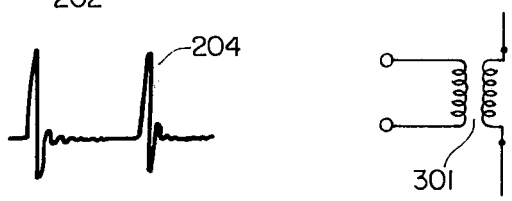

The pulsed voltage was generated using a Tesla transformer as illustrated in FIG. 2. The Tesla transformer, the input of which was connected to a 50 Hz, 100 V AC power source, produced pulses by the discharge of a transformer portion 202. The pulses so produced were boosted in voltage and passed through the resistor of the coupling circuit 204 where they were superposed on the DC voltage. At this time, the shape of the pulse was as indicated by reference numeral 204 and the pulse width and pulse cycle times were $10^{-7}$ sec and 20 msec, respectively.

The production conditions were as follows:
Gas introduced
  $SiH_4$ diluted with 20% Ar;
  gas flow rate: 110 ml/min;

partial pressure: 0.4 torr
Other conditions
  DC voltage: −700 V;
  electric power: 80 W
  Substrate temperature: 150° C.
  Distance between cathode and anode: 40 mm Under the above conditions, silicon was deposited on the substrate to a thickness of 10 μm. The production rate was 1.0 μm/min and the film formed was uniform.

As a comparison, a discharge was produced using only a DC electric field under the same conditions as above. In this case, only powder was formed on the glass substrate and no film was formed. When the thickness of the deposited material on the substrate with the transparent electrode reached 2 μm or more, surface breakdown marks, which were considered to be due to dielectric breakdown, appeared and only an uneven deposit of material was obtained.

Furthermore, it was confirmed that when only an AC voltage with an effective voltage and electric power equal to those of the DC current was applied, the production rate was as low as about 0.1 μm/min.

EXAMPLE 2

Figure 3:
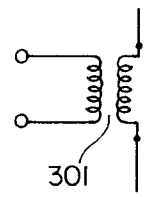
FIG. 3 shows an example of a coupled circuit to superpose a high frequency voltage.

The procedure of Example 1 was repeated with a high frequency electric field superposed on a DC electric field. The high frequency voltage was supplied from a high frequency power source at a frequency of 13.56 MHz and was superposed on the DC voltage by L-coupling of coils as indicated by reference numeral 301 in FIG. 3. With an application of a high frequency electric power of 50 W, silicon was deposited to a thickness of 5 μm. The production rate was 0.8 μm/min and a uniform film was obtained.

EXAMPLE 3

The procedure of Examples 1 and 2 was repeated with a high frequency electric field superposed on a DC electric field. A high frequency voltage was supplied from a high frequency power source operating at a frequency of 500 KHz and was superposed on a DC voltage with the coupling circuit shown in FIG. 3. Silicon was deposited to a thickness of 3 μm at a high frequency power of 100 W. The production rate was 0.5 μm/min and a uniform film was obtained.

What is claimed is:

1. A process for producing an amorphous semiconductor comprising the steps of: introducing a predetermined gas into a vacuum chamber and causing a discharge phenomenon by applying an electric field to decompose said gas, said electric field comprising a DC electric field superposed on one of a high frequency electric field and a pulsed electric field having a pulse width in a range of from about $10^{-10}$ sec. to about $10^{-3}$ sec. and a pulse cycle time in the ranges of from about $10^{-9}$ sec. to about $10^{-1}$ sec.

2. The process of claim 1 further comprising the step of maintaining a vacuum in said chamber within a pressure range of $10^{-2}$ torr to 10 torr.

3. The process of claim 1 wherein said electric field comprises a high frequency electric field having a frequency of 0.1 MHz to 100 MHz.

4. The process of claim 1 wherein said DC electric field is produced in response to a DC voltage in a range of from 0.1 KV to 5 KV.

5. The process of claim 1 wherein said predetermined gas comprises a gas selected from the group consisting of silane, silane compound, mixture of silane and an inert gas and further includes as a component one of C, N, O, and F.

6. The process of claim 5 wherein said predetermined gas further comprises a dopant gas.

7. The process of claim 6 wherein said dopant gas comprises a gas selected from the group consisting of $PH_3$ and $B_2H_6$.

8. The process of claim 7 wherein said predetermined gas further comprises $GeH_4$.

* * * * *